United States Patent
Lim et al.

(10) Patent No.: US 11,276,477 B2
(45) Date of Patent: Mar. 15, 2022

(54) MEMORY CONTROLLER AND OPERATING METHOD THEREOF

(71) Applicant: SK hynix Inc., Icheon-si (KR)

(72) Inventors: Su Jin Lim, Icheon-si (KR); Min Hwan Moon, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/080,748

(22) Filed: Oct. 26, 2020

(65) Prior Publication Data

US 2021/0375382 A1     Dec. 2, 2021

(30) Foreign Application Priority Data

May 27, 2020   (KR) .......................... 10-2020-0063673

(51) Int. Cl.
| | |
|---|---|
| G11C 29/40 | (2006.01) |
| G11C 29/42 | (2006.01) |
| G11C 29/44 | (2006.01) |
| G11C 29/50 | (2006.01) |
| G11C 16/34 | (2006.01) |
| G11C 29/12 | (2006.01) |

(52) U.S. Cl.
CPC .......... *G11C 29/42* (2013.01); *G11C 16/3495* (2013.01); *G11C 29/12005* (2013.01); *G11C 29/44* (2013.01); *G11C 29/50004* (2013.01); *G11C 2029/4402* (2013.01)

(58) Field of Classification Search
CPC ..... G11C 29/42; G11C 16/3495; G11C 29/44; G11C 29/50004; G11C 29/12005; G11C 2029/4402
See application file for complete search history.

(56) References Cited

U.S. PATENT DOCUMENTS

| | | | |
|---|---|---|---|
| 2015/0262694 A1* | 9/2015 | Seo | G11C 29/028 |
| | | | 714/764 |
| 2017/0329556 A1* | 11/2017 | Hirano | G06F 3/0655 |
| 2018/0285213 A1* | 10/2018 | Kim | G06F 11/1048 |

FOREIGN PATENT DOCUMENTS

| | | |
|---|---|---|
| KR | 10-1727704 B1 | 4/2017 |
| KR | 10-2019-0008643 A | 1/2019 |

* cited by examiner

*Primary Examiner* — Mohammed A Bashar
(74) *Attorney, Agent, or Firm* — Perkins Coie LLP

(57) ABSTRACT

A memory controller performs an efficient error correction operation. The memory controller controls a memory device. The memory controller includes: an error corrector configured to perform one or more error correction operations to correct an error included in data read from the memory device during a read operation, the one or more error correction operations including a first error correction operation performed using a first read voltage determined based on a threshold voltage distribution obtained by assuming that a number of memory cells in an erase state is equal to a number of memory cells in a program state and a data controller in communication with the error corrector to receive first error correction data obtained from the first error correction operation and configured to store the first error correction data in the memory controller.

17 Claims, 16 Drawing Sheets

FIG. 10

| COND_INF | EW_COUNT | READ_COUNT |
|---|---|---|
| DIE1 | 10 | 100 |
| DIE2 | 500 | 1000 |
| DIE3 | 30 | 700 |
| DIE4 | 100 | 200 |

MEMORY CONTROLLER AND OPERATING METHOD THEREOF

CROSS-REFERENCE TO RELATED APPLICATION

This patent document claims priority to and benefits of the Korean patent application number 10-2020-0063673, filed on May 27, 2020, which is incorporated herein by reference in its entirety.

TECHNICAL FIELD

Various implementations of the disclosed technology generally relate to an electronic device, and more particularly, to a memory controller and an operating method thereof.

BACKGROUND

Storage devices refer to electronic components that are configured to store data under on a permanent or temporary basis. Each storage device may include one or more storage medium to store data and operate based on a request from a host device. Examples of the host device include a computer, a smart phone, a smart pad, or other various electronic devices. The storage device can be classified based on the type of storage medium. For example, a Hard Disk Drive (HDD) uses a magnetic disk as the storage medium, and a Solid State Drive (SSD) and a memory card use, as the storage medium, semiconductor devices such as a volatile memory device and a nonvolatile memory device.

The storage device may include a memory device configured to store data and a memory controller configured to control the memory device. The memory device is generally classified into a volatile memory device and a nonvolatile memory device. Examples of the nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), or others.

SUMMARY

Embodiments of the disclosed technology provide a memory controller for performing an efficient error correction operation and an operating method of the memory controller.

In accordance with an aspect of the present disclosure, there is provided a memory controller for controlling a memory device, the memory controller including: an error corrector configured to perform one or more error correction operations to correct an error included in data read from the memory device during a read operation, the one or more error correction operations including a first error correction operation performed using a first read voltage determined based on a threshold voltage distribution obtained by assuming that a number of memory cells in an erase state is equal to a number of memory cells in a program state and a data controller in communication with the error corrector to receive first error correction data obtained from the first error correction operation and configured to store the first error correction data in the memory controller.

In another aspect, a memory controller for controlling a memory device is provided to include a plurality of dies, the memory controller comprising: an error corrector configured to determine an eboost read voltage to be used for a read operation, based on a threshold voltage distribution in which number of memory cells respectively corresponding to an erase state and program states are equally distributed, when an error is included in data read in the read operation of the memory device, and drive firmware to perform an eboost operation of correcting the error, based on the eboost read voltage; and an eboost data controller configured to store eboost data read from the memory device according to the eboost operation.

In accordance with another aspect of the present disclosure, there is provided a method for operating a memory controller for controlling a memory device, the method including: performing a first error correction operation to correct an error included in data read during a read operation of the memory device, determining, after a failure of the first error correction operation, a final read voltage, based on a threshold voltage distribution obtained by assuming that a number of memory cells in an erase state is equal to a number of memory cells in a program state, performing a second error correction operation to correct the error based on the final read voltage and storing an error correction data read from the memory device in the memory controller.

In another aspect, a method for operating a memory controller for controlling a memory device including a plurality of dies, the method comprising: correcting an error of data read according to a read operation of the memory device; determining an eboost read voltage to be used for the read operation, based on a threshold voltage distribution in which numbers of memory cells respectively corresponding to an erase state and program states after the error correction fails in the correcting of the error, and driving firmware to perform an eboost operation of correcting the error, based on the eboost read voltage; and storing eboost data read from the memory device according to the eboost operation.

BRIEF DESCRIPTION OF THE DRAWINGS

Example embodiments will now be described with reference to the accompanying drawings.

FIG. 10 is a diagram illustrating condition information.

DETAILED DESCRIPTION

The specific structural or functional description disclosed herein is merely illustrative for the purpose of describing embodiments of the disclosed technology. The embodiments of the disclosed technology can be implemented in various forms.

Hereinafter, exemplary embodiments of the disclosed technology will be described in detail with reference to the accompanying drawings.

Figure 1:
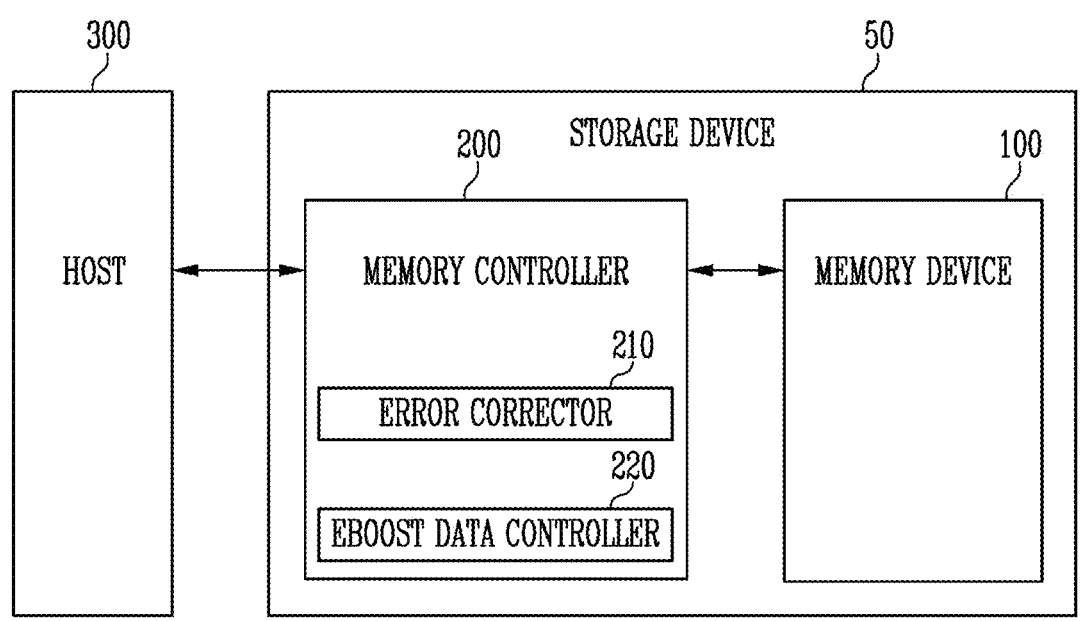
FIG. 1 is a block diagram illustrating an example of a storage device based on some implementations of the disclosed technology.

FIG. 1 is a block diagram illustrating a storage device.

Referring to FIG. 1, the storage device 50 may include a memory device 100 and a memory controller 200.

The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, or others.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), or a Wafer-level Stack Package (WSP).

The memory device 100 may store data. The memory device 100 operates in response to commands and control signals received from the memory controller 200. The memory device 100 may include a memory cell array including a plurality of memory cells for storing data. The memory cell array may include a plurality of memory blocks. Each memory block may include a plurality of memory cells, and the plurality of memory cells may constitute a plurality of pages. In an embodiment, the page may be a unit for storing or writing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or others. In some implementations of the disclosed technology that are discussed in this patent document, the memory device 100 is a NAND flash memory.

In an embodiment, the memory device 100 may be implemented in a two-dimensional array structure or three-dimensional array structure. Hereinafter, although a case where the memory device 100 is implemented in the three-dimensional array structure is described as an embodiment, the disclosed technology is not limited to the three-dimensional array structure. The disclosed technology may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may be operated using a Single Level Cell (SLC) method in which one data bit is stored in one memory cell. Alternatively, the memory device 100 may be operated using a method in which at least two data bits are stored in one memory cell. For example, the memory device 100 may be operated using a Multi-Level Cell (MLC) method in which two data bits are stored in one memory cell, a Triple Level Cell (TLC) method in which three data bits are stored in one memory cell, or a Quadruple Level Cell (QLC) method in which four data bits are stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

In an embodiment, the memory controller 200 may include an error corrector 210. The error corrector 210 may correct an error of data read in a read operation.

During the read operation, a threshold voltage is distributed to memory cells included in the memory device to perform the read operations on the memory cells. In some cases, however, a threshold voltage distribution to a plurality of memory cells included in the memory device 100 can be changed in an unexpected manner, for example, by retention or disturb. The unexpected change of the threshold voltage distribution can cause an error to occur during the read operation and the error may be included in read data due to the changed threshold voltage distribution. The error corrector 210 may correct the error of the read data.

In an embodiment, the error corrector 210 may perform error correction operations. The error correction operations may include various operations including a history read operation, a read retry operation, an eboost operation, a correction operation based on an error correction code, an assist read operation.

For example, the history read operation is an operation performed after an error correction operation of read data fails. When the error has been occurred during the read operation performed on a page, the history read operation may be performed by using read voltages that have been used for a successful read operation in a die of the memory device, the die including the page on which the read operation is performed.

For example, the read retry operation is an operation performed after the history read operation to correct the error fails. The read retry operation may be performing by using voltages included in a read retry table. The read retry table may be configured with voltages obtained by adding or subtracting predetermined offset voltages (e.g., +1V, −1V, +2V, −2V, . . . ) to or from a read voltage. The voltages included in the read retry table may be used for the read retry operation in a predetermined order. The voltages included in the read retry table may be a finite number of voltages. In some implementations, an error correction operation may be performed whenever the read retry operation is performed. In the read retry operation, a read operation may be performed by using only the read voltages included in the read retry table, and an error correction operation may be performed whenever the read operation is performed.

For example, the eboost operation may be an error correction operation performed after the read retry operation fails. The eboost operation may be performed by using a read voltage determined based on an ideal or near-ideal threshold voltage distribution of memory cells. The read voltage used during the eboost operation is referred to as an eboost read voltage and can be determined as discussed below.

In some implementations, when the memory device 100 performs a program operation in a SLC (single level cell) manner, an eboost read voltage to be used for the eboost operation may be determined based on a threshold voltage distribution obtained when assuming that the number of memory cells corresponding to an erase state is equal to the number of memory cells corresponding to a program state. In some implementations, when the memory device 100 performs a program operation in other than the SLC (single level cell) manner, an eboost read voltage to be used for the eboost operation may be determined based on a threshold voltage distribution obtained when assuming that the number of memory cells corresponding to an erase state is equal to the number of memory cells corresponding to each of program states. Based on the assumption that the number of memory cells corresponding to the erase state is equal to the number of memory cells corresponding to the program state, the number of memory cells are expected to be turned on (or turned off) during the eboost operation. This expected number of memory cells to be turned on (or turned off) is referred to as the expected number of memory cells turned on (or turned off). During the eboost operation using the eboost read voltage, the number of memory cells that are actually turned on (or actually turned off) may be compared with the expected number of memory cells turned on (or turned off).

In an embodiment, when the number of memory cells actually turned on during the read operation using the eboost read voltage is greater than the expected number of memory cells to be turned on, the error corrector 210 may decrease the eboost read voltage currently being used during the eboost operation. In some implementations, when the number of memory cells actually turned off is smaller than the expected number of memory cells to be turned off, the error corrector 210 may decrease the eboost read voltage currently being used during the eboost operation.

In some implementations, when the number of memory cells actually turned on during the read operation using the eboost read voltage is smaller than the expected number of memory cells to be turned on, the error corrector 210 may increase the eboost read voltage currently being used during the eboost operation. In some implementations, when the number of memory cells actually turned off is greater than that the expected number of memory cells to be turned off, the error corrector 210 may increase the eboost read voltage currently being used during the eboost operation.

The error corrector 210 can repeat increasing or decreasing of the eboost read voltage during the eboost operation. For example, in the eboost operation using the decreased or increased eboost read voltage, the number of memory cells actually turned on (or actually turned off) is compared again with the expected number of memory cells to be turned on (or to be turned off) and the error corrector 210 is configured to increase or decrease the eboost read voltage which has been already increased or decreased and is currently being used. In some implementations, when the number of memory cells actually turned on is greater than the expected number of memory cells to be turned on, the error corrector 210 may decrease the eboost read voltage currently being used during the eboost operation. When the number of memory cells actually turned on is smaller than the expected number of memory cells to be turned, the error corrector 210 may increase the eboost read voltage currently being used during the eboost operation.

In some implementations, in the eboost operation using the decreased or increased eboost read voltage, when the number of memory cells actually turned off is smaller than that the expected number of memory cells to be turned off, the error corrector 210 may decrease the eboost read voltage currently being used during the eboost operation. When the number of memory cells actually turned off is greater than the expected number of memory cells to be turned off, the error corrector 210 may increase the eboost read voltage currently being used during the eboost operation.

Based on the above-described manner, an optimum read voltage can be used during the eboost operation. Thus, the eboost operation can be performed until a difference between the number of memory cells actually turned on during the eboost operation performed using the current eboost read voltage and the expected number of memory cells to be turned on becomes equal to or less than a reference value.

Thus, it is possible to use the optimum read voltage to correct error included in data during the eboost operation. In some implementations, an error correction operation may be performed only when the optimum read voltage is determined. In this case, the error correction operation is not performed when the eboost read voltage is determined, if the determined eboost read voltage does not correspond to the optimum read voltage satisfying a condition that the difference between the number of memory cells actually turned on during the eboost operation performed using the current eboost read voltage and the expected number of memory cells to be turned on is equal to or less than the reference value.

For example, the assist read operation is a read operation performed after the eboost operation. The assist read operation may be an operation of reading memory cells by using a plurality of read voltages. For example, the assist read operation may be performed by using read voltages that are different from those used for the history read operation, the read retry operation, and the eboost operation, which were performed prior to the assist read operation, and that are adjacent to read voltages used during the error correction operations that have failed.

Since an additional read operation is required in the assist read operation, it may take much time to perform the error correction, which makes the assist read operation uneconomical.

To address this issue, in the disclosed technology, the error corrector 210 may store data read by the eboost operation, and perform an error correction operation by using the stored read data in the additional read operation performed subsequent to the eboost operation. The error corrector 210 may determine whether the data read by the eboost operation is to be stored, based on a program erase count and a read count of the memory device 100.

In an embodiment, the memory controller 200 may include an eboost data controller 220. The eboost data controller 220 may store data read in the eboost operation.

For example, when an error included data read from the memory device is not corrected by the read retry operation, the eboost operation may be performed. In the eboost operation, a plurality of data may be read. When the program erase count is equal to or greater than a first reference value and the read count is equal to or greater than a second reference value, the eboost data controller 220 may store the data read during the eboost operation in the memory controller 200.

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may include firmware (not shown) which receives data and a Logical Block Address (LBA) from the host 300, and translates the LBA into a Physical Block Address (PBA) representing addresses of memory cells included in the memory device 100, in which data is to be stored. Also, the memory controller 200 may store, in a buffer memory, a logical-physical address mapping table that establishes a mapping relationship between the LBA and the PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a PBA, and data. When a read request is received together with an LBA from the host 300, the memory controller 200 may change the read request into a read command, select a PBA corresponding to the LBA, and then provide the memory device 100 with the read command and the PBA. When an erase request is received together with an LBA from the host 300, the memory controller 200 may change the erase request into an erase command, select a PBA corresponding to the LBA, and then provide the memory device 100 with the erase command and the PBA.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SDRAM, a Low Power DDR (LPDDR), or a Rambus Dynamic Random Access Memory (RDRAM), or a Static Random Access Memory (SRAM).

In various embodiments, the buffer memory may be coupled to the storage device 50 at the outside of the storage device 50. Therefore, volatile memory devices coupled to the storage device 50 at the outside of the storage device 50 may perform functions of the buffer memory.

In an embodiment, the memory controller 200 may control at least two memory devices. The memory controller 200 may control the memory devices according to an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), or a Load Reduced DIMM (LRDIMM).

Figure 2:
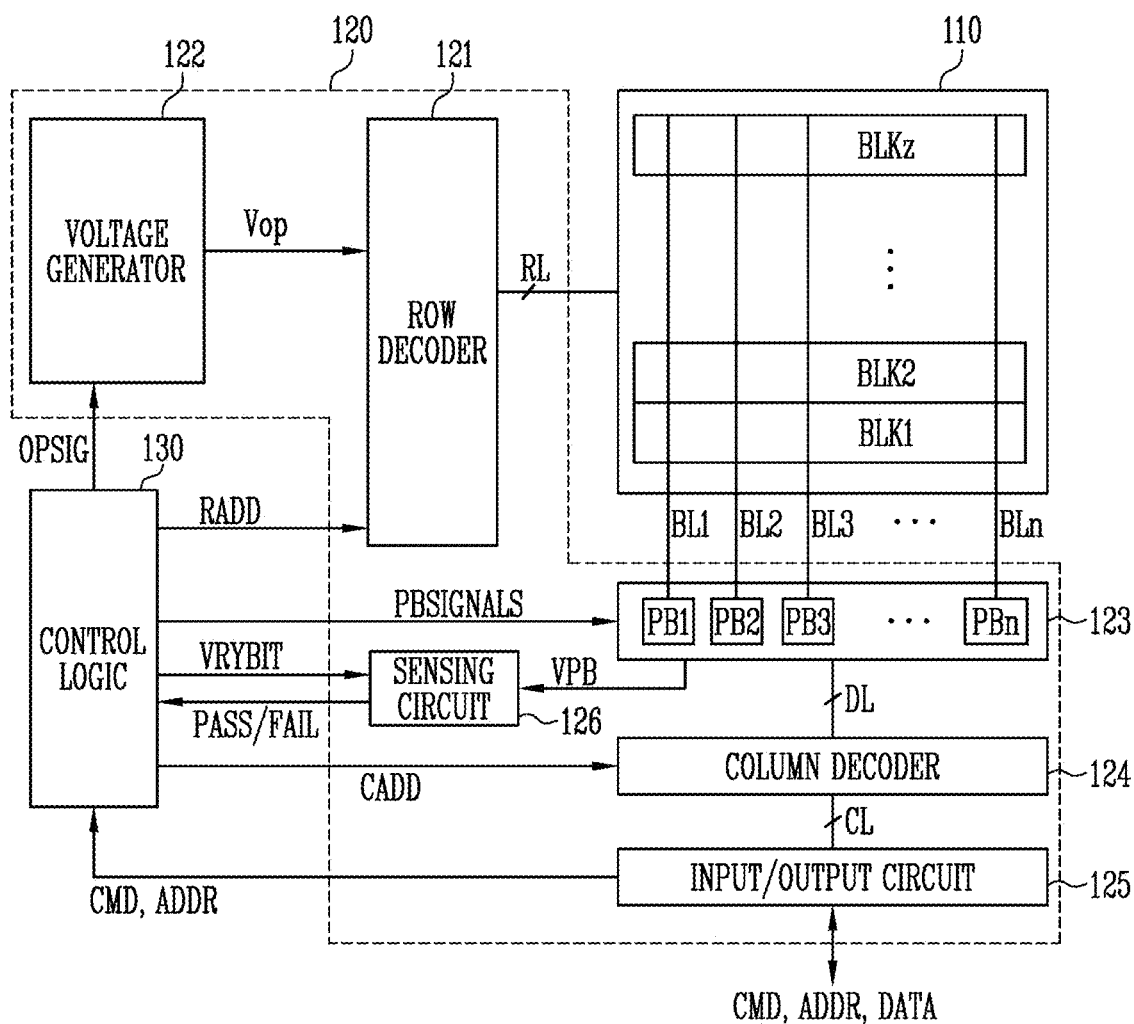
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 100, a peripheral circuit 120, and a control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 in response to commands and control signals received from the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through first to nth bit lines BL1 to BLn. The first to nth page buffers PB1 to PBn operate under the control of the control logic 130. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

For example, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing a voltage or current received from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 in response to commands and control signals received from the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller (200 shown in FIG. 1), to the control logic 130, or exchange data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation a selected sub-block included in the selected memory block in response to a sub-block erase command and an address. Also, the control logic 130 may determine whether the verify operation has passed or failed in response to the pass or fail signal PASS or FAIL.

Figure 3:
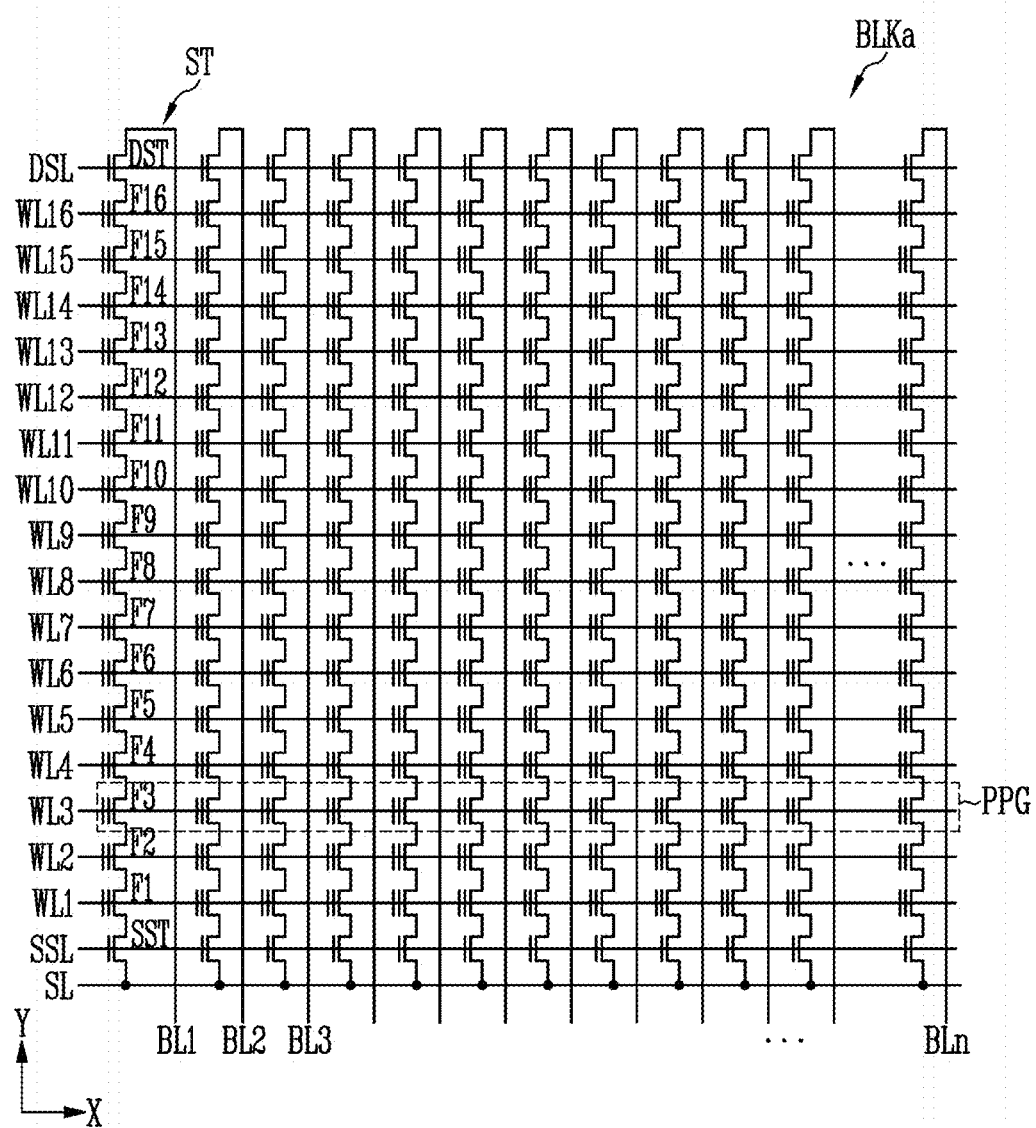
FIG. 3 is a diagram illustrating an embodiment of a memory cell array shown in FIG. 2.

FIG. 3 is a diagram illustrating an embodiment of the memory cell array shown in FIG. 2.

Referring to FIGS. 2 and 3, FIG. 3 is a circuit diagram illustrating any one memory block BLKa among the plurality of memory blocks BLK1 to BLKz included in the memory cell array 110 shown in FIG. 2.

In the memory block BLKa, a first select line, word lines, and a second select line, which are arranged in parallel, may be coupled to each other. For example, the word lines may be arranged in parallel between the first and second select lines. The first select line may be a source select line SSL, and the second select line may be a drain select line DSL.

In some implementations, the memory block BLKa may include a plurality of strings coupled between bit lines BL1 to BLn and a source line SL. The bit lines BL1 to BLn may be respectively coupled to the strings, and the source line SL may be commonly coupled to the strings. The strings may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings may be coupled to the source select line SSL, and gates of drain select transistors DST included in different strings may be coupled to the drain select line DSL. Gates of the memory cells F1 to F116 may be coupled to a plurality of word lines WL1 to WL16. A group of memory cells coupled to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PPG may store one logical page (LPG) data. The one LPG data may include data bits of which number corresponds to that of cells included in one physical page PPG. Alternately, one memory cell MC may store data of two or more bits. The memory cell is generally referred to as a multi-level cell (MLC). One physical page PPG may store two or more LPG data.

A memory cell for storing data of two or more bits is referred to as the MLC. As the number of bits of data stored in one memory cell increases, the MLC has recently meant as a memory cell for storing data of two bits. A memory cell for storing data of three or more bits is referred to as a triple level cell (TLC), and a memory cell for storing data of four or more bits is referred to as a quadruple level cell (QLC). Besides, memory cells for storing data of a plurality of bits have been developed, and this embodiment may be applied to memory cells in which data of two or more bits are stored.

In another embodiment, each of the plurality of memory blocks may have a three-dimensional structure. Each memory block may include a plurality of memory cells stacked on a substrate. The plurality of memory cells may be arranged along +X, +Y, and +Z directions.

Figure 4:
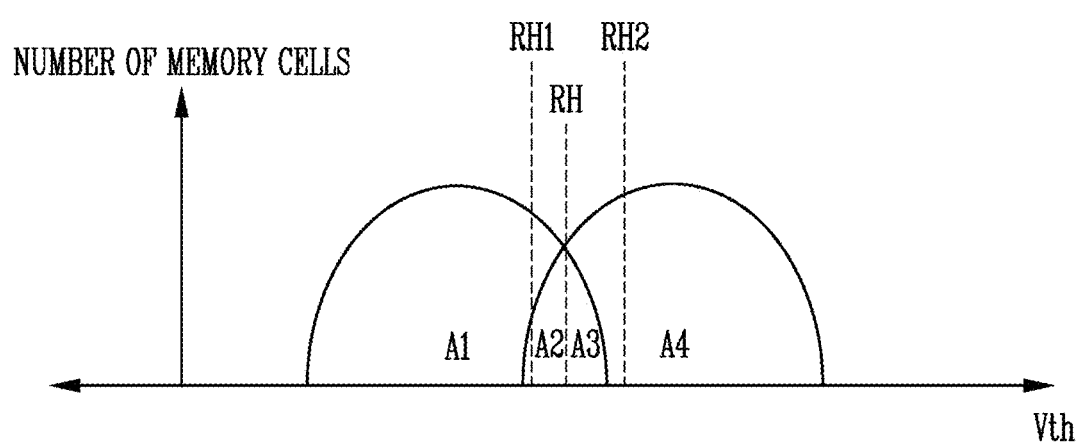
FIG. 4 is a diagram illustrating a history read operation performed in error correction.

FIG. 4 is a diagram illustrating a history read operation performed in error correction.

Referring to FIG. 4, FIG. 4 illustrates adjacent threshold voltage distributions among threshold voltage distributions of memory cells. The horizontal axis shown in FIG. 4 represents magnitudes Vth of threshold voltages of memory cells, and the vertical axis shown in FIG. 4 represents numbers of memory cells.

In an embodiment, when the memory device (100 shown in FIG. 1) performs a program operation by using a multi-level cell (MLC) method, FIG. 4 illustrates an example of threshold voltage distributions of memory cells of an erase state E and a first program state P1, the first program state P1 and a second program state P2, or the second program state P2 and a third program state P3.

FIG. 4 may be applied even when the memory device (100 shown in FIG. 1) performs a program operation by using a single level cell (SLC), triple level cell (TLC), or quadruple level cell (QLC) method.

A case where threshold voltage distributions of memory cells of the first program state P1 and the second program state P2 are illustrated in FIG. 4 is assumed.

Referring to FIG. 4, the memory device (100 shown in FIG. 1) may perform a read operation by using a voltage RH, corresponding to a read command received from the memory controller (200 shown in FIG. 1). Since memory cells of areas A1 and A2 are turned on when the memory device (100 shown in FIG. 1) performs the read operation by using the voltage RH, data read by using the voltage RH may be '1.' Since memory cells of areas A3 and A4 are turned off, the data read by using the voltage RH may be '0.'

When the memory device (100 shown in FIG. 1) performs the read operation by using the voltage RH, memory cells of the area A3 among memory cells of the first program state P1 may be turned off (0) due to a change in threshold voltage. That is, although the memory cells of the area A3 are memory cells of the first program state P1, the memory cells of the area A3 may be read as '0' when the memory cells of the area A3 are read by using the voltage RH.

In addition, when the memory device (100 shown in FIG. 1) performs the read operation by using the voltage RH, memory cells of the area A2 among memory cells of the second program state P2 may be turned on (1) due to a change in threshold voltage. That is, although the memory cells of the area A2 are memory cells of the second program state P2, the memory cells of the area A2 may be read as '1' when the memory cells of the area A2 are read by using the voltage RH.

Therefore, the error corrector (210 shown in FIG. 1) included in the memory controller (200 shown in FIG. 1) may perform error correction operations by receiving data read using the voltage RH. The error correction operations may include a history read operation, a read retry operation, an eboost operation, a correction operation based on an error correction code, an assist read operation, and the like.

In an embodiment, when error correction on the data read using the voltage RH fails, the error corrector (210 shown in FIG. 1) may control the memory device (100 shown in FIG.

1) to perform the history read operation. The history read operation is an operation performed after the error correction of the read data fails. The history read operation may be a read operation performed by using read voltages at which a read operation passes in a die including a page on which the read operation is performed.

For example, in the die including the page on which the read operation is performed, a read operation performed by using first and second history read voltages RH1 and RH2 among read operations which were previously performed may pass. The first and second history read voltages RH1 and RH2 may be voltages for distinguishing the first program state P1 and the second program state P2 from each other.

Therefore, after the read operation fails in FIG. 4, the error corrector (210 shown in FIG. 1) may instruct the memory device (100 shown in FIG. 1) to perform a read operation by using the first and second history read voltages RH1 and RH2. Subsequently, the error corrector (210 shown in FIG. 1) may perform error correction on data read by using the first and second history read voltages RH1 and RH2.

Figure 5:
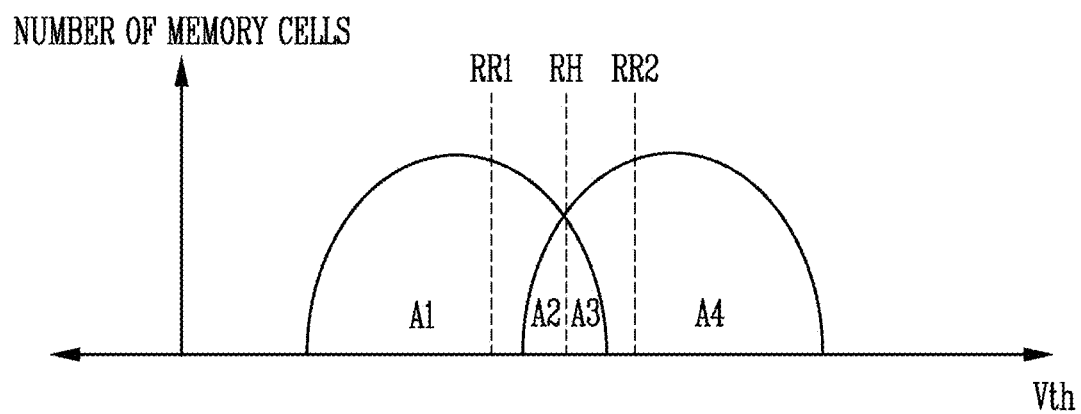
FIGS. 5A and 5B are diagrams illustrating a read retry operation performed after the history read operation.

FIGS. 5A and 5B are diagrams illustrating a read retry operation performed after the history read operation.

Referring to FIGS. 4, 5A and 5B, FIG. 5A illustrates the threshold voltage distributions shown in FIG. 4, and FIG. 5B illustrates a read retry table including voltages used for the read retry operation.

In an embodiment, a read retry operation may be performed after the history read operation shown in FIG. 4. Specifically, when the error of the read data is not corrected even by the history read operation, the error corrector (210 shown in FIG. 1) may control the memory device (100 shown in FIG. 1) to perform the read retry operation. The read retry operation may be an operation of performing reading by using voltages included in a read retry table. The read retry table may be configured with voltages obtained by adding or subtracting predetermined offset voltages to or from a read voltage.

The voltages included in the read retry table may be used for the read retry operation in a predetermined order. The voltages included in the read retry table may be a finite number of voltages. Further, an error correction operation may be performed whenever a read operation according to the read retry operation is performed. In the read retry operation, a read operation may be performed by using only the read voltages included in the read retry table, and an error correction operation may be performed whenever the read operation is performed.

In an embodiment, the error of the data read by the history read operation may not be corrected. The error corrector (210 shown in FIG. 1) may perform the read retry operation as a next error correction operation. The read retry operation may be performed with reference to the read retry table in FIG. 5B.

Referring to FIG. 5B, first and second read retry voltages RR1 and RR2 as voltages for distinguishing the first and second program states P1 and P2 from each other may be included in the read retry table. That is, two read retry voltages which are finite number may be included in the read retry table.

In an embodiment, when the error is not corrected by the history read operation, according to a predetermined order, a first read operation 1st READ may be first performed by using the first read retry voltage RR1, and a second read operation $2^{nd}$ READ may be then performed by using the second read retry voltage RR2.

In an embodiment, the first read retry voltage RR1 may be a voltage obtained by adding a predetermined first offset OFFSET1 to the voltage RH (RH+OFFSET1), and the second read retry voltage RR2 may be a voltage obtained by adding a predetermined second offset OFFSET2 to the voltage RH (RH+OFFSET2).

In another embodiment, various voltages in addition to the first and second read retry voltages RR1 and RR2 as the voltages for distinguishing the first and second program states P1 and P2 from each other may be included in the read retry table. In addition, a number of read voltages included in the read retry table may be various.

Figure 6:
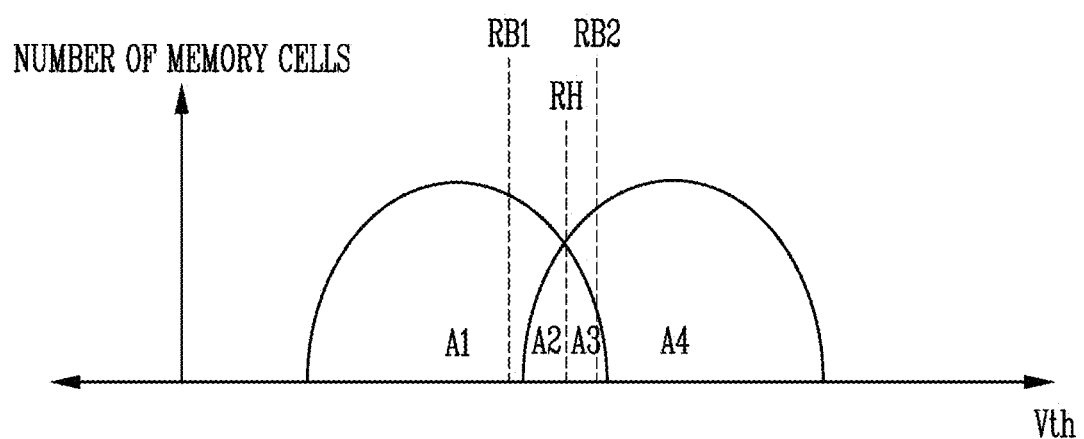
FIG. 6 is a diagram illustrating an eboost operation performed after the read retry operation.

FIG. 6 is a diagram illustrating an eboost operation performed after the read retry operation.

In an embodiment, when the error of the read data is not corrected even by the read retry operation, the error corrector (210 shown in FIG. 1) may perform an eboost operation. Thus, the eboost operation may be an error correction operation performed after the read retry operation.

In an embodiment, during the eboost operation, a final read voltage can be determined based on a result obtained by performing the read operation using an optimum read voltage determined based on an ideal threshold voltage distribution of memory cells.

For example, as discussed above with reference to FIG. 1, an eboost read voltage to be used for the eboost operation may be determined based on a threshold voltage distribution when assuming that the number of memory cells corresponding to an erase state is equal to the number of memory cells corresponding to a program states. When an eboost read voltage is determined, a number of memory cells that are actually turned on (or turned off) when the read operation is performed using the eboost read voltage may be compared with the expected number of memory cells turned on (or turned off).

For example, for the memory device (100 shown in FIG. 1) operates by using a multi-level cell (MLC) method, a voltage for distinguishing the first and second program states P1 and P2 from each other may be determined based on an ideal threshold voltage distribution obtained by assuming that the number of memory cells corresponding to the erase state is equal to the number of memory cells corresponding to the program state.

In FIG. 6, when assuming that a threshold voltage distribution of memory cells is an ideal threshold voltage distribution obtained by assuming that the numbers of memory cells respectively corresponding to the erase state and the program states are equally distributed, a first eboost read voltage RB1 may be determined as a candidate for an optimum eboost read voltage.

Subsequently, when the number of memory cells actually turned on during the read operation using the first eboost read voltage RB1 is greater than that the expected number of memory cells to be turned on, the error corrector is configured to decrease the eboost read voltage, and the decreased eboost read voltage may be determined as a next eboost read voltage. The expected number of memory cells to be turned on (or turned off) corresponds to the number of memory cells that are expected to be turned on (or turned off) such that the number of memory cells corresponding to the erase state is equal to the number of memory cells corresponding to the program state.

In some implementations, when the number of memory cells actually turned off during the read operation using the first eboost read voltage RB1 is smaller than the expected number of memory cells to be turned off, the error corrector is configured to decrease the eboost read voltage, and the decreased eboost read voltage may be determined as a next eboost read voltage.

In some implementations, when the number of memory cells actually turned on during the read operation using the first eboost read voltage RB1 is smaller than that the expected number of memory cells to be turned on, the error corrector is configured to increase the eboost read voltage, and the increased eboost read voltage may be determined as a next eboost read voltage.

In some implementations, when the number of memory cells actually turned off during the read operation using the first eboost read voltage RB1 is greater than the expected number of memory cells to be turned off, the error corrector is configured to increase the eboost read voltage, and the increased eboost read voltage may be determined as a next eboost read voltage.

In an embodiment, the eboost operation may be performed until a difference between the number of memory cells actually turned on during the read operation performed using the current eboost read voltage and the expected number of memory cells to be turned on is equal to or less than a reference value.

In FIG. 6, when assuming that the number of memory cells actually turned on during the read operation using the first eboost read voltage RB1 is smaller than the expected number of memory cells to be turned on as a result obtained by performing a read operation, the error corrector is configured to increase the first eboost read voltage RB1 and the increased first eboost read voltage RB1 is determined as a second eboost read voltage RB2 as a candidate for the optimum eboost read voltage. The amount of the increase can be determined by a ratio of the number of memory cell actually turned on or the number of memory cells actually turned off.

Subsequently, in the eboost read operation using the increased second eboost read voltage RB2, when the number of memory cells actually turned on is greater than the expected number of memory cells to be turned on, the error corrector is configured to decrease the second eboost read voltage RB2. When the number memory cells actually turned on is smaller than the expected number of memory cells to be turned on, the error corrector is configured to increase the second eboost read voltage RB2.

In some implementations, the number of memory cells actually turned off during the read operation using the increased second eboost read voltage RB2 is smaller than the expected number of memory cells to be turned off, the error corrector is configured to decrease the second eboost read voltage RB2. When the number of memory cells actually turned off is greater than the expected number of memory cells to be turned off, the error corrector is configured to increase the second eboost read voltage RB2.

Based on the above-described manner, an optimum read voltage can be determined by the eboost operation.

In the eboost operation, error correction can be performed using the finally determined optimum eboost read voltage. Thus, unlike the read retry operation shown in FIGS. 5A and 5B, an error correction operation is not performed whenever a read voltage is determined by the eboost read voltage, but error correction may be performed only using the finally determined optimum read voltage.

Figure 7:
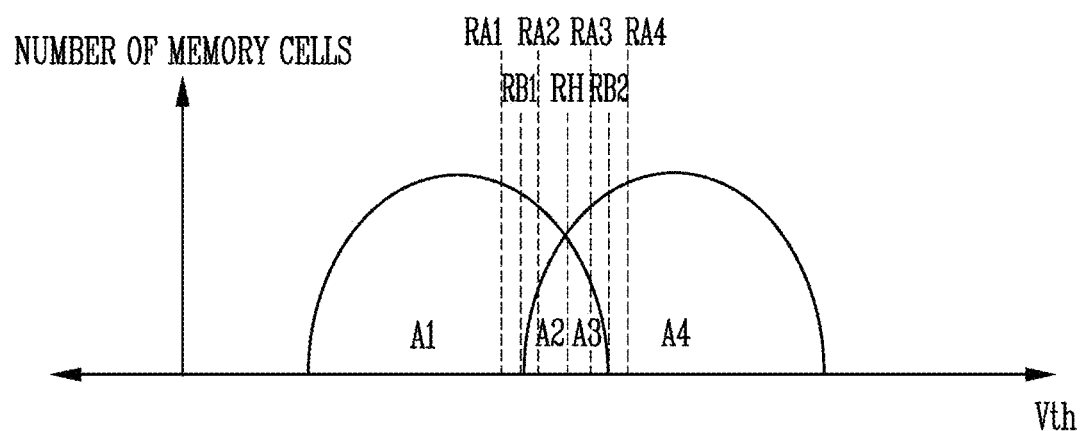
FIG. 7 is a diagram illustrating an assist read operation performed after the eboost operation.

FIG. 7 is a diagram illustrating an assist read operation performed after the eboost operation.

Referring to FIG. 7, FIG. 7 illustrates the threshold voltage distributions shown in FIG. 6.

In an embodiment, when the error of the read data is not corrected even by the eboost operation, the error corrector (210 shown in FIG. 1) may perform an assist read operation. That is, the assist read operation is an error correction operation performed after the eboost operation. The assist read operation may be performed by using read voltages different from those used for the history read operation, the read retry operation, and the eboost operation, which were previously performed, among voltages adjacent to a read voltage at which error correction fails.

In an embodiment, the assist read operation may be performed by using a plurality of read voltages adjacent to the voltage RH. For example, the read voltages adjacent to the voltage RH may be RH+Vad or RH−Vad, and Vad may have various values less than 1V. Thus, the read voltages used during the assist read operation have values close to the voltage RH. Although a case where a read operation is performed by using first to fourth assist read voltages RA1 to RA4 is illustrated in FIG. 7, the assist read operation may be performed by using a smaller number of assist read voltages or a larger number of assist read voltages. The first to fourth assist read voltages RA1 to RA4 may be read voltages different from those used for the history read operation, the read retry operation, and the eboost operation.

However, new read operations different from the read operations which were performed are to be additionally performed in the assist read operation, and hence it may take much time to perform error correction. Therefore, the performing of the assist read operation may cause performance degradation of the memory device (100 shown in FIG. 1).

In the disclosed technology, in order to prevent the performance degradation of the memory device (100 shown in FIG. 1), there is proposed an operation replacing the assist read operation by storing data read in the eboost operation, based on a program erase count EW_COUNT and a read count READ_COUNT, and performing a next error correction operation, based on the stored data.

In an embodiment, the assist read operation may be a read operation performed when positions of read voltages according to a log likelihood ratio (LLR) are distinguished. The LLR may be generated based on an error correction code (e.g., a Bose-Chaudhuri-Hocquenghem (BCH) code, a Low-Density Parity-Check (LDPC) code, or the like) or read data received from the memory device (100 shown in FIG. 1). Further, the reliability of read data may become higher as the absolute value of the LLR becomes larger.

Consequently, the assist read operation is an operation for distinguishing positions of read voltages according to the LLR, and it is unnecessary to finely tune the read voltages. Accordingly, in the disclosed technology, there is proposed a method for utilizing data read in the eboost operation which was previously performed as an error correction operation, instead of performing the assist read operation. That is, the positions of the read voltages according to the LLR may be distinguished based on data read by using the eboost read voltages which were used for the eboost operation.

However, a memory for storing data read in the eboost operation may be required. The memory for storing the data read in the eboost operation may be a static memory or a dynamic memory.

In an embodiment, when the data read in the eboost operation is stored in the memory, the error correction capability of another die may be degraded, and hence data read in the eboost operation may be stored under a certain requirement. For example, the error corrector may determine whether the data read in the eboost operation is to be stored, based on a program erase count EW_COUNT and a read count READ_COUNT of a die on which a read operation is performed.

A method for storing data read in the eboost operation, based on the program erase count EW_COUNT and the read count READ_COUNT of the die on which the read operation is performed will be described in more detail with reference to FIGS. 8 to 10.

Figure 8:
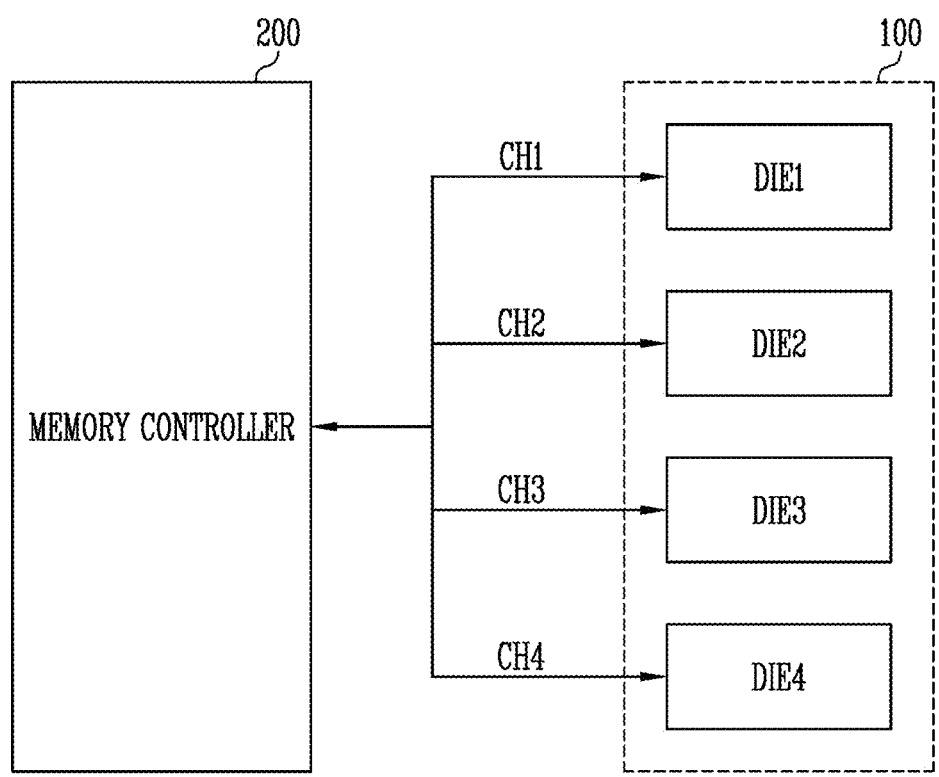
FIG. 8 is a diagram illustrating a plurality of dies included in the memory device shown in FIG. 1.

FIG. 8 is a diagram illustrating a plurality of dies included in the memory device shown in FIG. 1.

Referring to FIG. 8, the memory device 100 may include first to fourth dies DIE1 to DIE4. The first to fourth dies DIE1 to DIE4 may be coupled to the memory controller 200 respectively through first to fourth channels CH1 to CH4. Each of the first to fourth dies DIE1 to DIE4 may include a plurality of planes. Each of the plurality of planes may include a plurality of memory blocks. Each of the plurality of memory blocks may include a plurality of pages.

The memory device 100 shown in FIG. 8 includes the first to fourth dies DIE1 to DIE4. However, in another embodiment, the memory device 100 may include a smaller number of dies or a larger number of dies.

In an embodiment, the memory device 100 may include a plurality of dies. Operations may be independently performed in the plurality of dies. The memory controller 200 may independently control an operation performed in the first to fourth dies DIE1 to DIE4 through a channel.

In some implementations, the memory controller 200 may control the first die DIE1 through the first channel CH1, control the second die DIE2 through the second channel CH2, control the third die DIE3 through the third channel CH3, and control the fourth die DIE4 through the fourth channel CH4.

Therefore, the memory controller 200 may output a command, an address, and data to the first to fourth dies DIE1 to DIE4 through each channel such that an operation is performed in the first to fourth dies DIE1 to DIE4. The operation may be performed in the first to fourth dies DIE1 to DIE4, based on the command, the address, and the data, which are received through the first to fourth channels CH1 to CH4. The operation performed in the first to fourth dies DIE1 to DIE4 may be a program (write) operation, a read operation, or an erase operation. Data of the first to fourth dies DIE1 to DIE4 may be transmitted to the memory controller 200 through the first to fourth channels CH1 to CH4.

In an embodiment, a program (write) operation, a read operation, or an erase operation may be performed in the first to fourth dies DIE1 to DIE4. The program (write) operation and the read operation may be performed in a unit of a page, and the erase operation may be performed in a unit of a memory block.

In an embodiment, a program erase count EW_COUNT and a read count READ_COUNT may be determined for each die.

For example, a maximum value, a minimum value, or an average value of program erase counts EW_COUNT of each memory block included in the first die DIE1 may be determined as a program erase count EW_COUNT of the first die DIE1. The program erase count EW_COUNT may be a value increased by '1' whenever an erase operation is performed in a memory block.

For example, the read count READ_COUNT may also be determined for each die. For example, the read count READ_COUNT may be increased by '1' whenever a read operation is performed in the first die DIE1.

In an embodiment, whether data read in an eboost operation is to be stored may be determined with reference to the program erase count EW_COUNT and the read count READ_COUNT of each of the first to fourth dies DIE1 to DIE4.

Figure 9:
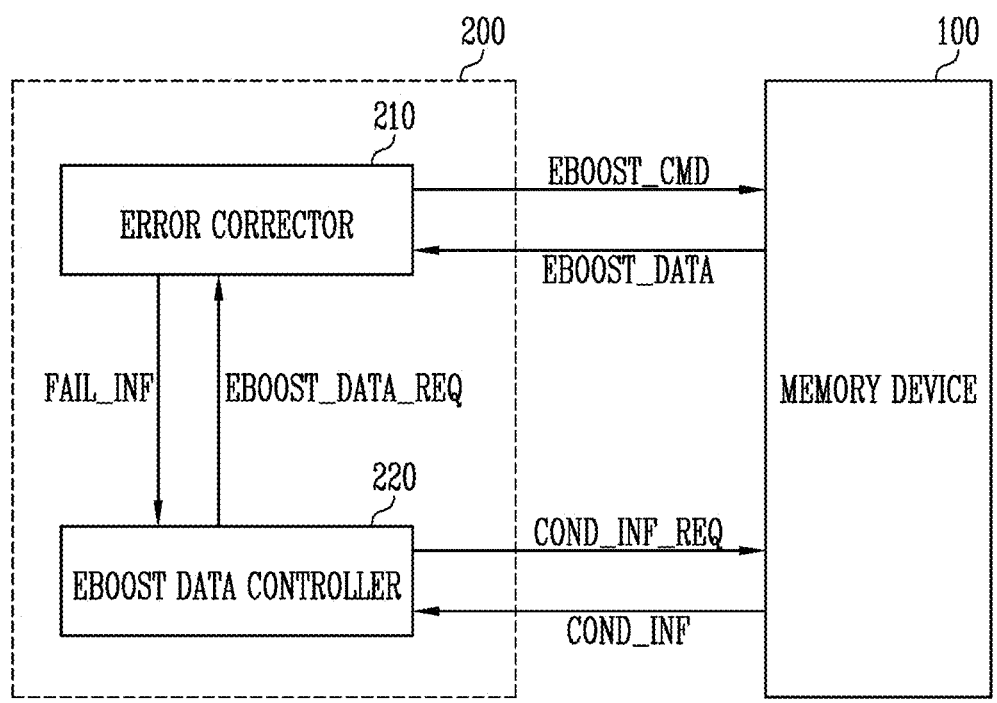
FIG. 9 is a diagram illustrating a configuration of a memory controller shown in FIG. 1 and a process of storing data read in the eboost operation.

FIG. 9 is a diagram illustrating a configuration of a memory controller shown in FIG. 1 and a process of storing data read in the eboost operation.

Referring to FIG. 9, the memory controller 200 shown in FIG. 9 may include an error corrector 210 and an eboost data controller 220. Referring to FIGS. 4, 5A, 5B, and 9, FIG. 9 illustrates an eboost operation performed after the history read operation shown in FIG. 4 and the read retry operation shown in FIGS. 5A and 5B and a process of storing data read by the eboost operation.

In an embodiment, when the error included in read data is not corrected by the read retry operation performed by the error corrector 210, the error corrector 210 may perform a next error correction operation. For example, the error corrector 210 may perform an eboost operation.

Therefore, the error corrector 210 may output, to the memory device 100, an eboost command EBOOST_CMD instructing the memory device 100 to perform a read operation by using eboost read voltages. The eboost read voltages may be voltages adjacent to an optimum read voltage for distinguishing program states from each other when assuming that a threshold voltage distribution of memory cells is an ideal threshold voltage. In this case, an eboost read voltage to be used for the eboost operation may be determined based on a threshold voltage distribution obtained on the assumption that the number of memory cells corresponding to an erase state is equal to the number of memory cells corresponding to a program state, and the eboost operation may be performed by using the determined eboost read voltage. In some implementations, the determined eboost read voltage can be further increased or decreased for a next eboost read operation based on a result of the eboost operation performed using the determined eboost read voltage.

In an embodiment, the memory device 100 may perform a read operation by using the eboost read voltages, corresponding to the eboost command EBOOST_CMD, and output, to the error corrector 210, eboost data EBOOST_DATA as a result obtained by performing reading, using a finally determined eboost read voltage. The error corrector 210 may receive the eboost data EBOOST_DATA from the memory data 100, and perform an error correction operation on the eboost data EBOOST_DATA. In some implementations, unlike the read retry operation, the error correction can be performed on the data read using the finally determined eboost read voltage.

The error correction performed by the error corrector 210, based on the eboost data EBOOST_DATA, may also fail. In the disclosed technology, an operation replacing an assist read operation performed after the eboost operation may be performed.

In some implementations, when the error correction by the error corrector 210 on the eboost data EBOOST_DATA read using the finally determined eboost read voltage fails, the error corrector 210 may output, to the eboost data controller 220, fail information FAIL_INF representing that the error correction failed.

The eboost data controller 220 may output a condition information request COND_INF_REQ to the memory device 100, based on the fail information FAIL_INF. The condition information request COND_INF_REQ may be a request for acquiring condition information COND_INF of each of the plurality of dies included in the memory device 100. The condition information COND_INF may include information on a program erase count EW_COUNT and a read count READ_COUNT.

In an embodiment, the program erase count EW_COUNT may be a value increased by '1' whenever an erase operation is performed on a memory block. In addition, the program erase count EW_COUNT included in the condition information COND_INF is a value determined for each die, and may be a maximum value, a minimum value, or an average value of program erase counts EW_COUNT on memory blocks included in a die. The read count READ_COUNT included in the condition information COND_INF is a value determined for each die, and may be a value increased by '1' whenever a read operation is performed in a die.

In an embodiment, the memory device 100 may output condition information COND_INF in response to the condition information request COND_INF_REQ. The condition information COND_INF may include information on a program erase count EW_COUNT and a read count READ_COUNT for each die.

The eboost data controller 220 may output an eboost data request EBOOST_DATA_REQ to the error corrector 210, based on the condition information COND_INF received from the memory device 100. That is, in order to acquire the eboost data EBOOST_DATA received from the memory device 100, the eboost data controller 220 may output the eboost data request EBOOST_DATA_REQ to the error corrector 210.

For example, when a program erase count EW_COUNT corresponding to a die including a page on which the eboost operation is performed is equal to or greater than a first reference value, and a read count READ_COUNT corresponding to the die is equal to or greater than a second reference value, the eboost data controller 220 may output the eboost data request EBOOST_DATA_REQ to the error corrector 210. Thus, the reliability of data stored in the memory device 100 may become lower as the program erase count EW_COUNT and the read count READ_COUNT become larger. Hence, when the program erase count EW_COUNT is equal to or greater than the first reference value and the read count READ_COUNT is equal to or greater than the second reference value, eboost data EBOOST_DATA may be stored in SRAM (static random access memory) or DRAM (dynamic random access memory) included in the eboost data controller 220, and an error correction operation may be performed by using the stored eboost data EBOOST_DATA.

In an embodiment, the eboost data controller 220 may receive eboost data EBOOST_DATA from the error corrector 210 and store the received eboost data EBOOST_DATA. Subsequently, the eboost data controller 220 may output eboost data EBOOST_DATA according to a request of the error corrector 210, and the error corrector 210 may perform a next error correction operation, based on the eboost data EBOOST_DATA.

FIG. 10 is a diagram illustrating condition information.

Referring to FIGS. 9 and 10, FIG. 10 illustrates condition information COND_INF received from the memory device (100 shown in FIG. 9), corresponding to the condition information request COND_INF_REQ shown in FIG. 9. In FIG. 10, it is assumed that first to fourth dies DIE1 to DIE4 are included in the memory device (100 shown in FIG. 9). In another embodiment, a smaller number of dies or a larger number of dies may be included in the memory device (100 shown in FIG. 9).

Referring to FIG. 10, the condition information COND_INF may include a program erase count EW_COUNT and a read count READ_COUNT for each die. The program erase count EW_COUNT may be a maximum value, a minimum value, or an average value of program erase counts EW_COUNT of memory blocks included in a die. The read count READ_COUNT may be a value increased by '1' whenever a read operation is performed on each die.

In FIG. 10, it is assumed that a first reference value is '500' and a second reference value is '1000.'

In an embodiment, a program erase count EW_COUNT corresponding to the first die DIE1 may be '10,' and a read count READ_COUNT corresponding to the first die DIE1 may be '100.' A program erase count EW_COUNT corresponding to the second die DIE2 may be '500,' and a read count READ_COUNT corresponding to the second die DIE2 may be '1000.' A program erase count EW_COUNT corresponding to the third die DIE3 may be '30,' and a read count READ_COUNT corresponding to the third die DIE3 may be '700.' A program erase count EW_COUNT corresponding to the fourth die DIE4 may be '100,' and a read count READ_COUNT corresponding to the fourth die DIE4 may be '200.'

In an embodiment, the program erase count EW_COUNT of the second die DIE2 among the first to fourth dies DIE1 to DIE4 may be the first reference value or more, and the read count READ_COUNT of the second die DIE2 among the first to fourth dies DIE1 to DIE4 may be the second reference value or more. Therefore, Since each of the program erase count EW_COUNT and the read count READ_COUNT of the second die DIE2 among the first to fourth dies DIE1 to DIE4 is the reference value or more, only eboost data EBOOST_DATA corresponding to the second die DIE2 may be stored in the eboost data controller (220 shown in FIG. 9).

Therefore, when the eboost operation is performed on the second die DIE2, the eboost data controller (220 shown in FIG. 9) may output an eboost data request EBOOST_DATA_REQ to the error corrector (210 shown in FIG. 9), and receive and output eboost data EBOOST_DATA corresponding to the eboost data request EBOOST_DATA_REQ.

However, when the eboost operation is performed on a die except the second die DIE2, the eboost data controller (220 shown in FIG. 9) may not output the eboost data request EBOOST_DATA_REQ.

When the eboost data controller (220 shown in FIG. 9) does not output the eboost data request EBOOST_DATA_REQ, the error corrector (210 shown in FIG. 9) may perform an assist read operation as a next error correction operation.

Figure 11:
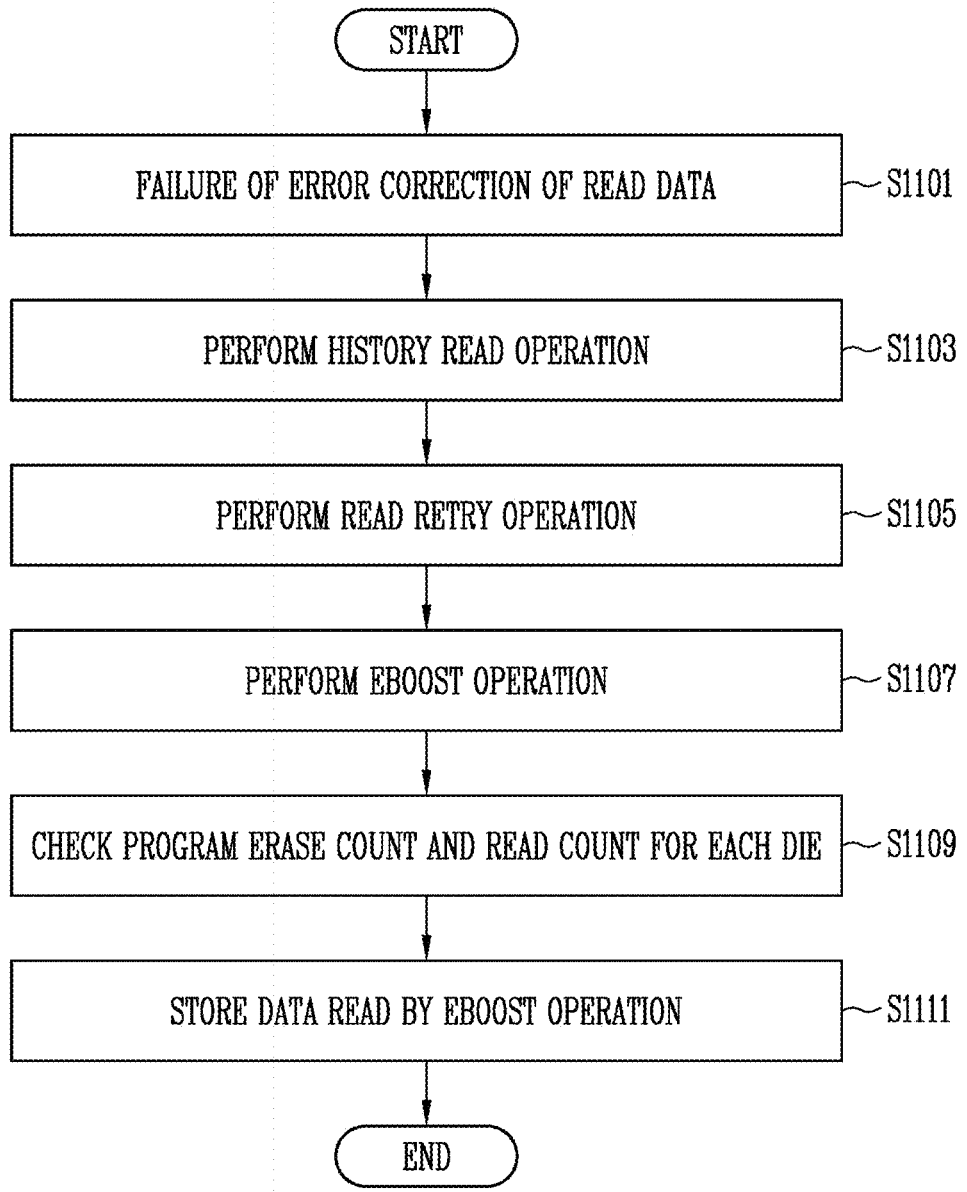
FIG. 11 is a diagram illustrating an operation of the memory controller in accordance with an embodiment of the present disclosure.

FIG. 11 is a diagram illustrating an operation of the memory controller in accordance with an embodiment of the disclosed technology.

Referring to FIG. 11, in step S1101, an error correction operation on data read from the memory device is performed but fails to correct the error. In this case, the memory controller may perform additional error correction operation(s) for correcting the error included in the read data.

In step S1103, the memory controller may perform a history read operation. The history read operation is an operation performed after the failure of the error correction operation. When the error has been occurred during the read operation performed on a page, the history read operation may be a read operation performed by using read voltages that have been used for a successful read operation in a die including the page on which the read operation is performed.

When the error is not corrected even though the memory controller has performed the history read operation, the operation proceeds to step S1105.

In step S1105, the memory controller may perform a read retry operation. The read retry operation may be performing by using voltages included in a read retry table. The read retry table may be configured with voltages obtained by adding or subtracting predetermined offset voltages (e.g., +1V, −1V, +2V, −2V, . . . ) to or from a read voltage.

The voltages included in the read retry table may be used for the read retry operation in a predetermined order. The voltages included in the read retry table may be a finite number of voltages. In some implementations, an error correction operation may be performed whenever the read retry operation is performed. In the read retry operation, a read operation may be performed by using only the read voltages included in the read retry table, and an error correction operation may be performed whenever the read operation is performed.

When the error is not corrected even though the memory controller has performed the read retry operation, a next error correction operation may be performed in step S1107.

In step S1107, the memory controller may perform an eboost operation. The eboost operation may be an error correction operation performed after the read retry operation. During the eboost operation, a final read voltage may be determined based on a result obtained by performing the read operation using an optimum read voltage determined based on an ideal threshold voltage distribution of memory cells.

In some implementations, an eboost read voltage to be used for the eboost operation may be determined based on a threshold voltage distribution obtained when assuming that a number of memory cells in an erase state is equal to a number of memory cells in a program state. When an eboost read voltage is determined, a number of memory cells actually turned on (or actually turned off) may be compared with the expected number of memory cells turned on (or turned off) when assuming that numbers of memory cells respectively corresponding to an erase state and program states are equally distributed. The expected number of memory cells turned on or turned off refer to the number of memory cells that are expected to be turned on or turned off, when assumed that the number of memory cells corresponding to the erase state is equal to the number of memory cells corresponding to the program state When the number of memory cells actually turned on during the read operation using the eboost read voltage is greater than the expected number of memory cells predicted to be turned on, the error corrector 210 may decrease the eboost read voltage. In some implementations, when the number of memory cells actually turned off is smaller than the expected number of memory cells to be turned off, the error corrector 210 may decrease the eboost read voltage.

In some implementations, when the number of memory cells actually turned off during the read operation using the eboost read voltage is smaller than the expected number of memory cells to be turned on, the error corrector 210 may increase the eboost read voltage. In some implementations, when the number of memory cells actually turned on during the read operation using the eboost read voltage is greater than the expected number of memory cells to be turned off, the error corrector 210 may increase the eboost read voltage.

The error corrector 210 can repeat increasing or decreasing of the eboost read voltage during the eboost operation. For example, in the eboost operation using the decreased or increased eboost read voltage, when the number of memory cells actually turned on is greater than the expected number of memory cells to be turned on, the error corrector 210 may decrease the eboost read voltage which has been decreased or increased and is currently being used. When the number of memory cells actually turned on during the read operation using the current eboost read voltage is smaller than that the expected number of memory cells to be turned on, the error corrector 210 may increase the eboost read voltage being currently used.

Based on the above-described manner, an optimum read voltage can be determined during the eboost operation. For example, the eboost operation may be performed until a difference between the number of memory cells actually turned on during the eboost operation performed using the current eboost read voltage and the expected number of memory cells to be turned becomes equal to or less than a reference value.

In some implementations, when the error is not corrected even after the memory controller has performed the eboost operation, a next error correction operation may be performed.

In the disclosed technology, an operation replacing an assisting read operation may be performed as the next error correction operation of the eboost operation. For example, new read operations different from the read operations which have been performed may be additionally performed in the assist read operation, which causes performance degradation of the memory device (100 shown in FIG. 1). Hence, the operation replacing the assist read operation may be performed.

In step S1109, the memory controller may check a program erase count and a read count for each die included in the memory device. The program erase count may be determined as any one of a maximum value, a minimum value, and an average value in program erase counts of a plurality of memory blocks included in a die. The program erase count may be a value increased by '1' whenever an erase operation is performed on a memory block. The read count may be a value increased by '1' whenever a read operation is performed on a die.

In step S1111, the memory controller may store data read during the eboost operation. For example, when each of the program erase count and the read count of the die on which the read operation is performed is equal to or greater than the reference value, the memory controller may store data read during the eboost operation, and use the stored data in a next error correction operation. Thus, the error correction operation is performed based on the data read from the eboost operation, so that the assist read operation can be omitted. Accordingly, error correction efficiency can be improved.

Figure 12:
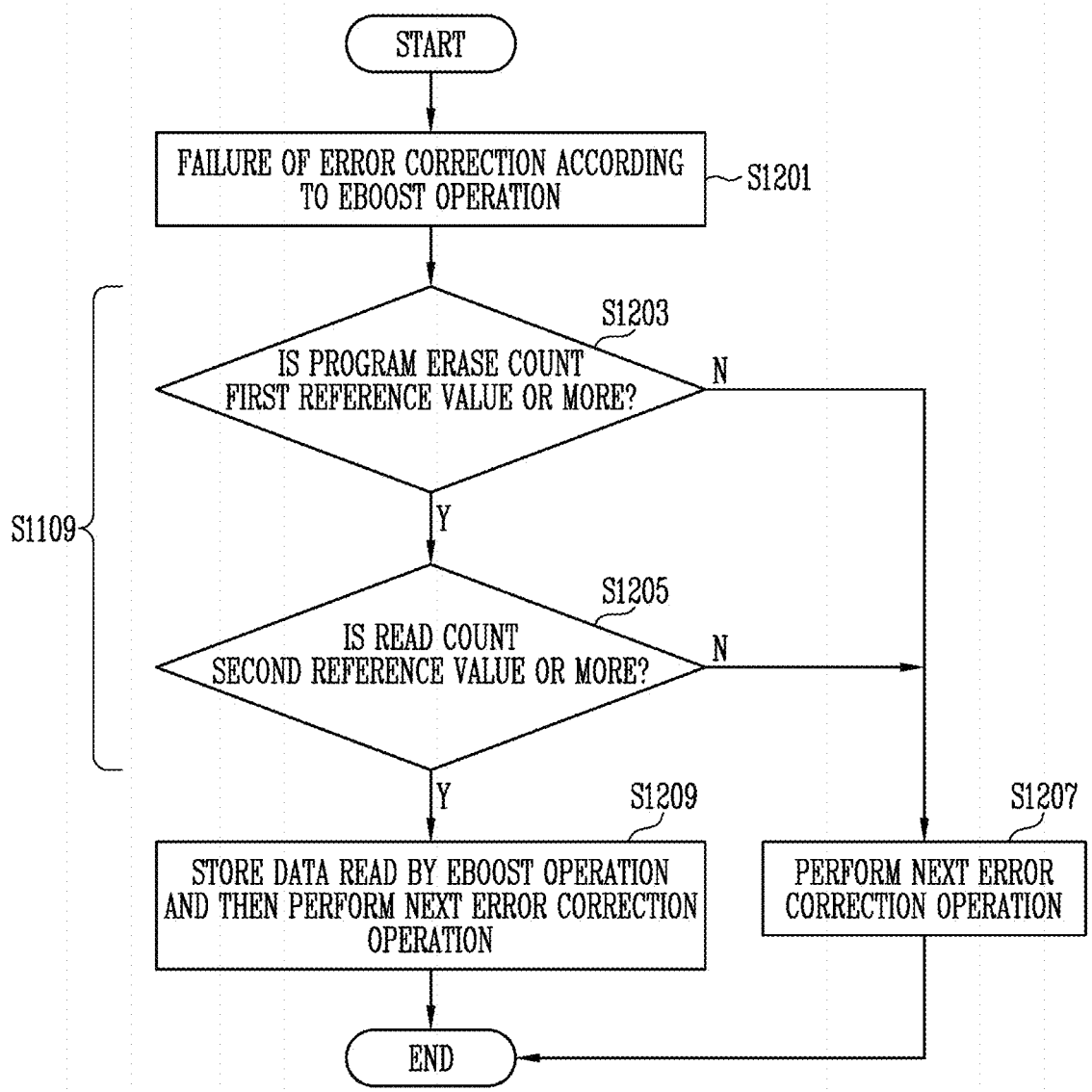
FIG. 12 is a diagram illustrating an operation of the memory controller in accordance with an embodiment of the disclosed technology.

FIG. 12 is a diagram illustrating an operation of the memory controller in accordance with an embodiment of the disclosed technology.

When the error correction of read data fails, the error corrector performs additional error correction operations including a history read operation, a read retry operation, and an eboost operation which may be sequentially performed. In the eboost operation which is performed after the failures of the error correction operations according to the history read operation and the read retry operations, the error correction performed during the eboost operation based on data read using a finally determined eboost read voltage may also fail. Referring to FIG. 12, in step S1201, the error correction according to the eboost operation has been failed.

In step S1203, when the error correction performed during the eboost operation fails, the memory controller may determine whether a program erase count of a die on which a read operation is performed is equal to or greater than a first reference value. A program erase count may be determined as any one of a maximum value, a minimum value, or an average value of program erase counts of a plurality of memory blocks included in the die.

When the program erase count is equal to or greater than the first reference value, the memory controller proceeds to step S1205. When the program erase count is less than the first reference value, the memory controller proceeds to step S1207.

In the step S1205, the memory controller may determine whether the read count is equal to or greater than a second reference value. When the read count is equal to or greater than the second reference value, the memory controller proceeds to step S1209. When the read count is less than the second reference value, the memory controller proceeds to the step S1207.

In the step S1209, the memory controller may store data read during the eboost operation and perform a next error correction operation using the stored data. When the program erase count of the die on which the read operation is performed is equal to or greater than the first reference value, and the read count of the die on which the read operation is performed is equal to or greater than the second reference value, the memory controller may store data read during the eboost operation. The stored data may be used for the next error correction operation, and hence the assist read operation can be omitted. Thus, performance degradation of the memory device (100 shown in FIG. 1) can be prevented, and error correction efficiency can be improved.

In some implementations, when the program erase count of the die on which the read operation is performed is less than the first reference value, or the read count of the die on which the read operation is performed is less than the second reference value, the memory controller may perform the next error correction operation in the step S1207. In this case, the memory controller does not store the data read during the eboost operation and may perform an error correction operation using an error correction code and/or an assist read operation.

Figure 13:
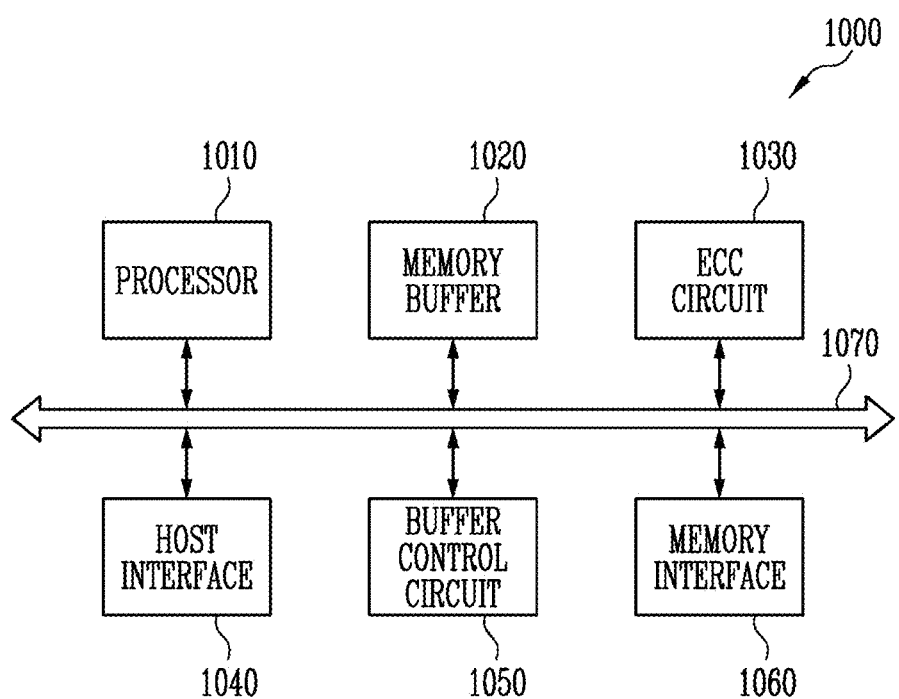
FIG. 13 is a diagram illustrating another embodiment of the memory controller shown in FIG. 1.

FIG. 13 is a diagram illustrating another embodiment of the memory controller shown in FIG. 1.

Referring to FIG. 13, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may store data processed by the processor 1010. The memory buffer 1020 may include a Static RAM (SRAM) or a Dynamic RAM (DRAM).

The ECC circuit 1030 may perform an ECC operation.

The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

In an embodiment, the ECC circuit 1030 may correct an error included in data read from the memory device (100 shown in FIG. 9). When the error correction of the ECC circuit 1030 fails, the ECC circuit 1030 may perform a next error correction operation. A history read operation, a read retry operation, an eboost operation, a correction operation based on an error correction code, an assist read operation, and the like may be included in the next error correction operation.

Specifically, the history read operation is an operation performed after error correction of read data fails. The history read operation may be a read operation performed by using read voltages at which a read operation passes in a die including a page on which the read operation is performed. In addition, the read retry operation is an operation performed based on voltages included in a read retry table, and priority orders between the voltages may be determined. The eboost operation may be an operation of determining a final read voltage, based on a result obtained by performing reading by using an optimum read voltage determined based on an ideal threshold voltage distribution of memory cells. The assist read operation is a correction operation performed next to the eboost operation. The assist read operation may be an operation for distinguishing positions of read voltages according to a log likelihood ratio (LLR).

However, new read operations different from the read operations which were performed are to be additionally performed in the assist read operation, and hence it may take much time to perform error correction. Consequently, the performing of the assist read operation may cause performance degradation of the memory device (100 shown in FIG. 1).

Therefore, when the error correction according to the eboost operation fails, the processor 1010 may determine a program erase count EW_COUNT and a read count READ_COUNT of the die on which the read operation is performed. That is, the processor 1010 may determine whether the program erase count EW_COUNT is a first reference value or more and whether the read count READ_COUNT is a second reference value or more. The program erase count EW_COUNT is a value increased by '1' whenever an erase operation is performed on a memory block, and may be a maximum value, a minimum value, or an average value of program erase counts EW_COUNT of memory blocks included in the die. The read count READ_COUNT may be a value increased by '1' whenever a read operation is performed on each die.

Subsequently, when the program erase count EW_COUNT is the first reference value or more, and the read count READ_COUNT is the second reference value or more, the processor 1010 may store data read in the eboost operation in the memory buffer 1020, and the ECC circuit 1030 may perform a next error correction operation, based on the read data stored in the memory buffer 1020.

Consequently, the error correction operation is performed based on the data read by the eboost operation, so that the assist read operation can be omitted. Accordingly, error correction efficiency can be improved.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000.

In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 14:
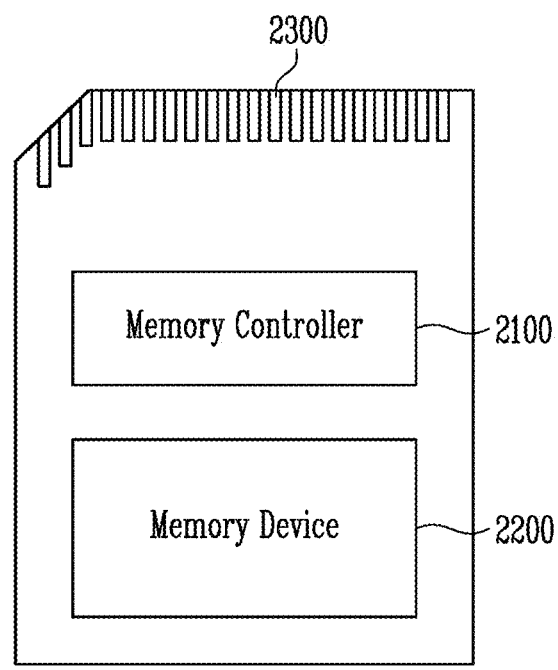
FIG. 14 is a block diagram exemplarily illustrating a memory card system to which the storage device is applied in accordance with an embodiment of the disclosed technology.

FIG. 14 is a block diagram exemplarily illustrating a memory card system to which the storage device is applied in accordance with an embodiment of the disclosed technology.

Referring to FIG. 14, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented identically to the memory device 100 (100 shown in FIG. 1).

In an example, the memory controller 2100 may include components such as a Random Access Memory (RAM), a processing unit, a host interface, a memory interface, and the error corrector 210.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

In an embodiment, the memory controller 2100 may correct an error included in data read from the memory device 2200. When the error correction of the ECC circuit 1030 fails, the memory controller 2100 may perform a next error correction operation. A history read operation, a read retry operation, an eboost operation, a correction operation based on an error correction code, an assist read operation, and the like may be included in the next error correction operation.

Specifically, the history read operation is an operation performed after error correction of read data fails. The history read operation may be a read operation performed by using read voltages at which a read operation passes in a die including a page on which the read operation is performed. In addition, the read retry operation is an operation performed based on voltages included in a read retry table, and priority orders between the voltages may be determined. The eboost operation may be an operation of determining a final read voltage, based on a result obtained by performing reading by using an optimum read voltage determined based on an ideal threshold voltage distribution of memory cells. The assist read operation is a correction operation performed next to the eboost operation. The assist read operation may be an operation for distinguishing positions of read voltages according to a log likelihood ratio (LLR).

However, new read operations different from the read operations which were performed are to be additionally performed in the assist read operation, and hence it may take much time to perform error correction. Consequently, the performing of the assist read operation may cause performance degradation of the memory device 2200.

Therefore, when the error correction according to the eboost operation fails, the memory controller 2100 may determine a program erase count EW_COUNT and a read count READ_COUNT of the die on which the read operation is performed. That is, the memory controller 2100 may determine whether the program erase count EW_COUNT is a first reference value or more and whether the read count READ_COUNT is a second reference value or more. The program erase count EW_COUNT is a value increased by '1' whenever an erase operation is performed on a memory block, and may be a maximum value, a minimum value, or an average value of program erase counts EW_COUNT of memory blocks included in the die. The read count READ_COUNT may be a value increased by '1' whenever a read operation is performed on each die.

Subsequently, when the program erase count EW_COUNT is the first reference value or more, and the read count READ_COUNT is the second reference value or more, the memory controller 2100 may store data read in the eboost operation, and perform a next error correction operation, based on the read data stored in the memory controller 2100.

Consequently, the error correction operation is performed based on the data read by the eboost operation, so that the assist read operation can be omitted. Accordingly, error correction efficiency can be improved.

Figure 15:
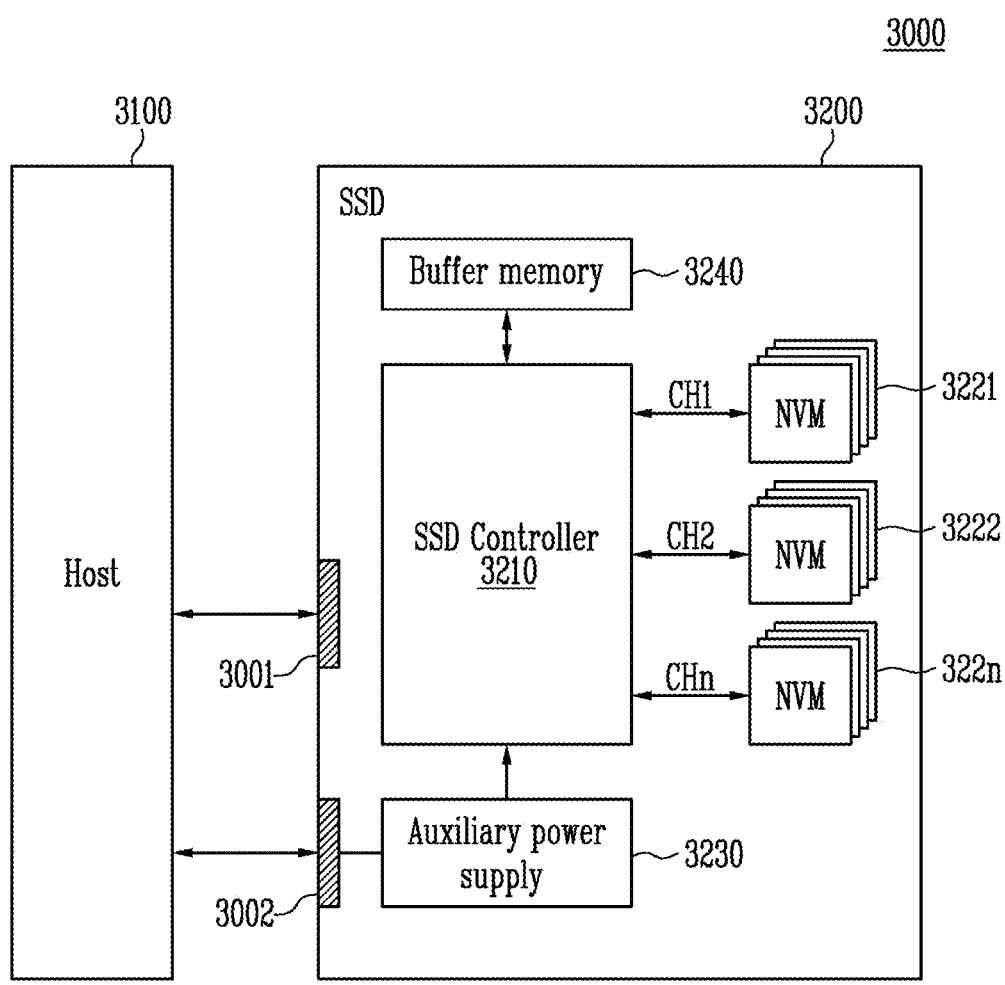
FIG. 15 is a block diagram exemplarily illustrating a Solid State Drive (SSD) system to which the storage device is applied in accordance with an embodiment of the disclosed technology.

FIG. 15 is a block diagram exemplarily illustrating a Solid State Drive (SSD) system to which the storage device is applied in accordance with an embodiment of the disclosed technology.

Referring to FIG. 15, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller (200 shown in FIG. 1).

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, or an NVMe.

In an embodiment, the SSD controller 3210 may correct an error included in data read from the plurality of flash memories 3221 to 322n. When the error correction fails, the SSD controller 3210 may perform one or more additional error correction operations which include at least one of a history read operation, a read retry operation, an eboost operation, a correction operation based on an error correction code, an assist read operation, or others.

In some implementations, the history read operation is an operation performed after error correction of read data fails. The history read operation may be a read operation performed by using read voltages at which a read operation passes in a die including a page on which the read operation is performed. In addition, the read retry operation is an operation performed based on voltages included in a read retry table, and priority orders between the voltages may be determined. The eboost operation may be an operation of determining a final read voltage, based on a result obtained by performing reading by using an optimum read voltage determined based on an ideal threshold voltage distribution of memory cells. The assist read operation is a correction operation performed next to the eboost operation. The assist read operation may be an operation for distinguishing positions of read voltages according to a log likelihood ratio (LLR).

In some implementations, new read operations different from the read operations which were performed are to be additionally performed in the assist read operation, and hence it may take much time to perform error correction. Consequently, the performing of the assist read operation may cause performance degradation of the plurality of flash memories 3221 to 322n.

Therefore, when the error correction according to the eboost operation fails, the SSD controller 3210 may determine a program erase count EW_COUNT and a read count READ_COUNT of the die on which the read operation is performed. That is, the SSD controller 3210 may determine whether the program erase count EW_COUNT is a first reference value or more and whether the read count READ_COUNT is a second reference value or more. The program erase count EW_COUNT is a value increased by '1' whenever an erase operation is performed on a memory block, and may be a maximum value, a minimum value, or an average value of program erase counts EW_COUNT of memory blocks included in the die. The read count READ_COUNT may be a value increased by '1' whenever a read operation is performed on each die.

Subsequently, when the program erase count EW_COUNT is the first reference value or more, and the read count READ_COUNT is the second reference value or more, the SSD controller 3210 may store data read in the eboost operation, and perform a next error correction operation, based on the read data stored in the SSD controller 3210.

Consequently, the error correction operation is performed based on the data read by the eboost operation, so that the assist read operation can be omitted. Accordingly, error correction efficiency can be improved.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-M RAM, and a PRAM.

Figure 16:
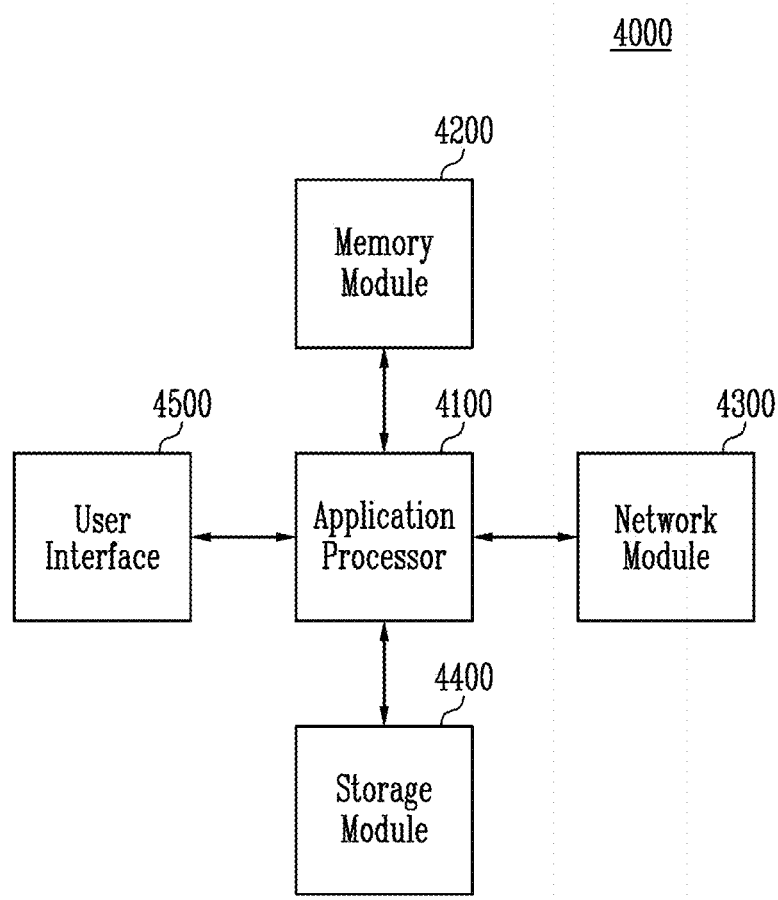
FIG. 16 is a block diagram exemplarily illustrating a user system to which the storage device is applied in accordance with an embodiment of the disclosed technology.

FIG. 16 is a block diagram exemplarily illustrating a user system to which the storage device is applied in accordance with an embodiment of the disclosed technology.

Referring to FIG. 16, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

In an embodiment, the application processor 4100 may correct an error included in data read from the storage module 4400. When the error correction fails, the application processor 4100 may perform one or more additional correction operations which include a history read operation, a read retry operation, an eboost operation, a correction operation based on an error correction code, an assist read operation, or others.

In some implementations, the history read operation is an operation performed after error correction of read data fails. The history read operation may be a read operation performed by using read voltages at which a read operation passes in a die including a page on which the read operation is performed. In addition, the read retry operation is an operation performed based on voltages included in a read retry table, and priority orders between the voltages may be determined. The eboost operation may be an operation of determining a final read voltage, based on a result obtained by performing reading by using an optimum read voltage determined based on an ideal threshold voltage distribution of memory cells. The assist read operation is a correction operation performed next to the eboost operation. The assist read operation may be an operation for distinguishing positions of read voltages according to a log likelihood ratio (LLR).

In some implementations, new read operations different from the read operations which were performed are to be additionally performed in the assist read operation, and hence it may take much time to perform error correction. Consequently, the performing of the assist read operation may cause performance degradation of the storage module 4400.

Therefore, when the error correction according to the eboost operation fails, the application processor 4100 may determine a program erase count EW_COUNT and a read count READ_COUNT of the die on which the read operation is performed. That is, the application processor 4100 may determine whether the program erase count EW_COUNT is a first reference value or more and whether the read count READ_COUNT is a second reference value or more. The program erase count EW_COUNT is a value increased by '1' whenever an erase operation is performed on a memory block, and may be a maximum value, a minimum value, or an average value of program erase counts EW_COUNT of memory blocks included in the die. The read count READ_COUNT may be a value increased by '1' whenever a read operation is performed on each die.

Subsequently, when the program erase count EW_COUNT is the first reference value or more, and the read count READ_COUNT is the second reference value or more, the application processor 4100 may store data read in the eboost operation, and perform a next error correction operation, based on the read data stored in the application processor 4100.

Consequently, the error correction operation is performed based on the data read by the eboost operation, so that the assist read operation can be omitted. Accordingly, error correction efficiency can be improved.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the disclosed technology, the assist read operation among the error correction operations is minimized, so that error correction can be efficiently performed.

While the disclosed technology has been shown and described with reference to certain exemplary embodiments thereof, it will be understood by those skilled in the art that various changes in form and details may be made based on what is described and illustrated in this patent document. Therefore, the scope of the disclosed technology should not be limited to the above-described exemplary embodiments.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto.

What is claimed is:

1. A memory controller for controlling a memory device, comprising:
    an error corrector configured to perform a first error correction operation to correct an error included in data read from a selected page included in the memory device; and
    a data controller configured to, in response to a failure of the first error correction operation, determine whether to store first error correction data in the memory controller, using a program erase count corresponding to a number of times that an erase operation is performed on a die including the selected page from among dies included in the memory device, and a read count corresponding to a number of times that a read operation is performed on the die,
    wherein the error corrector is configured to perform a second error correction operation based on the first error correction data stored in the memory controller.

2. The memory controller of claim 1, wherein the error corrector is configured to decrease a level of a first read voltage in a case that a number of memory cells that are turned on by the first read voltage is greater than an expected number of memory cells that are to be turned on to according to a threshold voltage distribution.

3. The memory controller of claim 2, wherein the error corrector is further configured to perform a read operation to read the data from the selected page using a decreased level of the first read voltage and adjust the decreased level of the first read voltage based on a comparison between a number of memory cells that are turned on by the decreased level of the first read voltage and the expected number of memory cells.

4. The memory controller of claim 1, wherein the error corrector is configured to increase a level of a first read voltage in a case that a number of memory cells that are turned on by the first read voltage is smaller than an expected number of memory cells that are to be turned on according to a threshold voltage distribution.

5. The memory controller of claim 4, wherein the error corrector is further configured to perform a read operation to read the data from the selected page using an increased level of the first read voltage and adjust the increased level of the first read voltage based on a comparison between a number of memory cells that are turned on during the first error correction operation using the increased first read voltage and the expected number of memory cells.

6. The memory controller of claim 1, wherein the data controller is configured to determine whether the program erase count is equal to or greater than a first reference value.

7. The memory controller of claim 6, wherein, in a case that the program erase count is equal to or greater than the first reference value, the data controller is configured to determine whether the read count is equal to or greater than a second reference value.

8. The memory controller of claim 7, wherein, in a case that the read count is equal to or greater than the second reference value, the data controller is configured to output a request to the error corrector to provide the first error correction data.

9. The memory controller of claim 8, wherein the error corrector is configured to receive the first error correction data from the memory device and configured to provide the first error correction data corresponding to the request to the data controller.

10. The memory controller of claim 8, wherein the data controller is configured to output, to the error corrector, the first error correction data in response to a request from the error corrector.

11. The memory controller of claim 7, wherein, in a case that the program erase count is less than the first reference value or that the read count is less than the second reference value, the error corrector is configured to perform an assist read operation by using read voltages that are determined adjacent to a read voltage used during the read operation.

12. A method for operating a memory controller for controlling a memory device, the method comprising:
    performing a first error correction operation to correct an error included in data read from a selected page included in the memory device;
    after a failure of the first error correction operation, determining a final read voltage, based on a threshold voltage distribution obtained by assuming that a number of memory cells in an erase state is equal to a number of memory cells in a program state;
    performing a second error correction operation to correct the error based on the final read voltage;
    after a failure of the second error correction operation, determining whether to store an error correction data read from the memory device using a program erase count and a read count; and
    if the error correction data is stored in the memory controller, performing a third error correction operation using the error correction data stored in the memory controller.

13. The method of claim 12, wherein the determining of the final read voltage includes:
    determining a first read voltage; and
    decreasing a level of the first read voltage, when a number of memory cells that are turned on by the first read voltage is greater than an expected number of memory cells that are to be turned on according to a threshold voltage distribution.

14. The method of claim 12, wherein the determining of the final read voltage includes:

determining a first read voltage; and increasing a level of the first read voltage, when a number of memory cells that are turned on by the first read voltage is smaller than an expected number of memory cells that are to be turned on according to a threshold voltage distribution.

15. The method of claim 12, wherein the program erase count is related to a number of times that an erase operation is performed on a die including the selected page from among dies included in the memory device, wherein the read count represents a number of times that a read operation is performed on the die.

16. The method of claim 15, wherein the determining further includes whether the program erase count is equal to or greater than a first reference value.

17. The method of claim 16, wherein the determining further includes whether the read count is equal to or greater than a second reference value.

\* \* \* \* \*